United States Patent [19]

Janes et al.

[11] 4,453,305

[45] Jun. 12, 1984

[54] METHOD FOR PRODUCING A MISFET

[75] Inventors: Timothy W. Janes, Worcester; John C. White, Malvern, both of England

[73] Assignee: The Secretary of State for Defence in Her Britannic Majesty's Government of the United Kingdom of Great Britain and Northern Ireland, London, England

[21] Appl. No.: 397,343

[22] Filed: Jul. 12, 1982

[30] Foreign Application Priority Data

Jul. 31, 1981 [GB] United Kingdom ............... 8123507

[51] Int. Cl.³ .................... H01L 21/22; H01L 21/285
[52] U.S. Cl. ........................................ 29/571; 29/580; 29/591; 148/187; 156/626; 156/651
[58] Field of Search ................. 29/571, 580, 591; 156/626, 651; 148/1.5, 187

[56] References Cited

U.S. PATENT DOCUMENTS

| 3,675,313 | 7/1972 | Driver et al. | 29/571 |
| 4,004,341 | 1/1977 | Tung | 29/571 |
| 4,145,459 | 3/1979 | Goel | 29/571 X |
| 4,157,610 | 6/1979 | Kamei et al. | 29/571 |

OTHER PUBLICATIONS

D. L. Kendall, "On Etching Very Narrow Grooves in Silicon", Appl. Phys. Letters, vol. 26, No. 4, (Feb. 15, 1975), pp. 195-198.
K. E. Bean, "Anisotropic Etching of Silicon", IEEE Trans. Electron Devices, vol. ED-25, No. 10, pp. 1185-1193, (Oct. 1978).
"Reliability and Degradation—Semi-conductor Devices and Circuits" by Howes et al., John Wiley & Sons, N.Y., p. 204.
"Solid State Physics" by A. J. Dekker, Macmillan and Co., Ltd., 1960, p. 9.
"Introduction to Solid State Physics" by C. Kittel, John Wiley and Sons, Inc., 3rd Edition, N.Y., p. 22.
Ammar et al., *IEEE Transactions on Electron Devices*, vol. ED-27, No. 5, May 1980, pp. 907-914.
Jackson et al., *IEEE Electron Device Letters*, vol. ED-L-2, No. 2, Feb. 1981, pp. 44 and 45.
Reisman et al., *Journal of the Electrochemical Society*, vol. 126, No. 8, Aug. 1979, pp. 1406-1415.

*Primary Examiner*—G. Ozaki
*Attorney, Agent, or Firm*—Cushman, Darby & Cushman

[57] ABSTRACT

A method for producing a MISFET having a gate electrode formed at the base of a grooved recess. The grooved recess is formed with steep side-walls (e.g., be reactive ion etching, ion beam milling or by using an orientation dependent etchant) and gate and source and drain contacts are formed by the simultaneous deposition of conductive material (e.g., metal evaporated from a point source.) Steepness of the side-walls of the recess ensures separation of the conductive material, isolating the gate electrode from the remaining conductive material providing the source and drain contacts.

A silicon MISFET may be produced, using a diazine catalyzed ethylenediamine-pyrocatechol-water solution etchant, and exposing the (110) crystal plane face of the silicon to the etchant to form the recess.

7 Claims, 8 Drawing Figures

METHOD FOR PRODUCING A MISFET

TECHNICAL FIELD

The present invention concerns a method for producing a MISFET (e.g. metal-insulator-semiconductor field-effect transistor), and in particular a MISFET wherein the gate is provided in a groove between the source and drain regions of the semiconductor substrate.

Grooved gate type MISFET's will generally exhibit better source-drain breakdown voltage and reduced channel length modulation than the more conventional type of MISFET in which the source, drain and gate channel regions are co-planar. With the short channel lengths attainable, and resulting high speed performance, grooved gate type MISFET's are likely to have wide application in high speed and high integration MOSLSI's.

PRIOR ART

A grooved gate type MISFET has been described in the Japanese Journal of Applied Physics, grooved gate MOSFET Volume 16 (1977), Supplement 16-1, pp. 179-183 by Nishimatsu et al. As there described in MISFET gate, source, and drain contacts are produced in a process including two poly-silicon deposition stages and a final aluminium deposition stage. In this technique the poly-silicon gate in the grooved region is provided without use of a photomask. It relies on photoresist lying in the dip in the poly-silicon covering the grooved surface, where it is about twice as thick as that elsewhere. As the photoresist layer is removed by oxygen plasma, photoresist is left in the grooved gate region. When therefore the second layer of poly-silicon is etched, the remaining photoresist serves to mask the underlying poly-silicon, and the latter then provides the gate electrodes of the MISFET.

The need to produce a substantial dip in the second poly-silicon layer sets practical limit on the groove width, and thus limits the minimum gate channel length afforded by this technique. Furthermore, the groove is substantially filled with poly-silicon and this necessarily introduces undesirable capacitance, this arising between the gate poly-silicon and the adjacent source and drain poly-silicon contacts. These set limits on the operational speed, and thus frequency response of the MISFET.

DISCLOSURE OF THE INVENTION

The present invention is intended to provide an alternative and simpler method of production, one intended to obviate the above limitations.

In accordance with the invention there is provided a method for producing a MISFET, the method comprising the following steps: providing a substrate of single crystal semiconductor material; forming an excess doped region of semiconductor material of opposite conductivity type for providing the source and drain regions of the MISFET; forming, between and immediately adjacent the source and drain regions, a steep-walled groove extending depthwise at least to the interface between the excess doped material and the underlying substrate material; forming an insulating layer over the surfaces of the groove and over the excess doped material, windows being provided in the insulating layer to expose the source and drain regions of the excess doped material; depositing conductive material so to cover simultaneously to exposed source and drain regions and the base of the groove, to the exclusion of the steep side-walls of the groove; and, annealing the whole to consolidate the contact junctions between the conductive material and the excess doped material. The conductive material is preferably metallic, being of metal or of a metallic silicide.

In this way therefore there may be provided a grooved gate MISFET having metallic contacts and a metallic gate, with source and drain junction depths $\leq$ zero.

Preferably, the conductive material is of metal and is deposited by evaporation from a point source.

The steep-walled groove may be formed by wet etching, using an orientation dependent etchant. In this case the substrate of semiconductor material is provided with appropriate crystal orientation.

Alternatively, the steep-walled groove may be formd by ion beam etching or milling.

BRIEF DESCRIPTION OF THE DRAWINGS

Embodiments of the invention will now be described, by way of example only, with reference to the accompanying drawings of which.

DESCRIPTION OF EMBODIMENTS OF THE INVENTION

Figure 1:
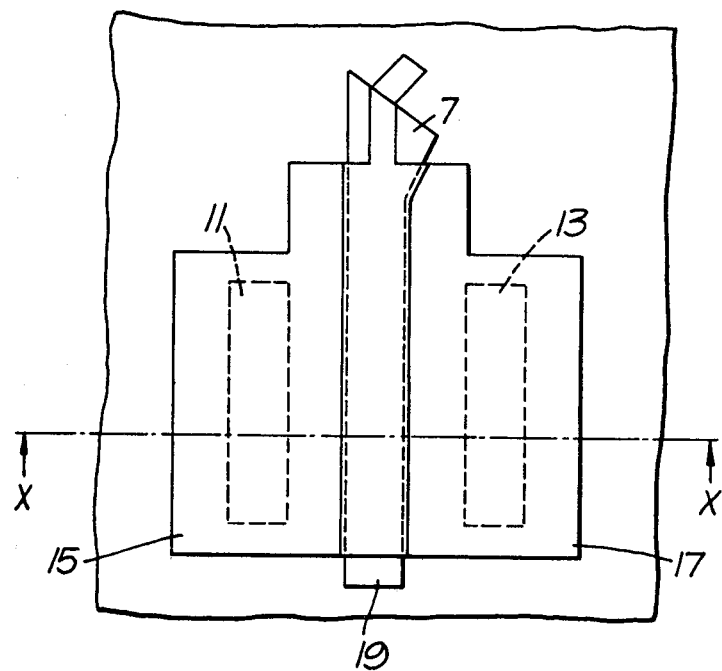
FIG. 1 is a plan view of a grooved-gate MISFET produced by a method in accordance with this invention.
Figure 2:
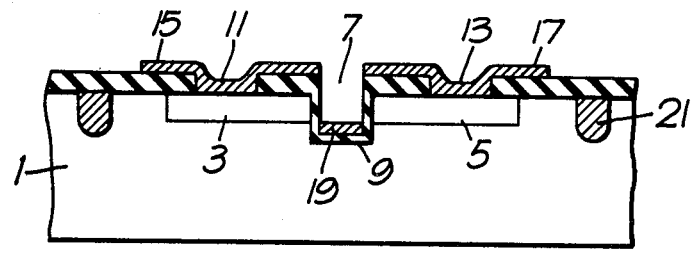
FIG. 2 is a cross-section of the MISFET in the plane X-X of FIG. 1.

The grooved gate MISFET shown in FIGS. 1 and 2 comprises a substrate 1 of p-type silicon semiconductor material on which have been formed two regions of excess doped n+-type silicon, a source region 3 and a drain region 5. A steep-walled groove 7 has been formed between and immediately ajacent these two regions 3 and 5 and extends depthwise beneath the interface between the excess doped material (the regions 3 and 5) and the underlying p-type silicon material (substrate 1). A thin oxide insulating layer 9 covers the base and side walls of the groove and the upper surface of the source and drain regions. Contact windows 11 and 13 in the insulating layer allow contact between the source and drain regions 3 and 5 and corresponding overlying metal electrodes—in fact of aluminium metal—electrodes 15 and 17, respectively. A gate electrode 19, also of aluminium, is located at the base of the groove 7. The distance between the source-substrate interface and the base of the gate electrode, and the distance between the drain-substrate interface and the base of the gate electrode, are equal and of finite value, and this junction depth $x_j$ is, by convention, of negative sign. As shown, the lower surface of the gate electrode 19 lies below the n+-p-interface. The overlap of the gate with the source and drain regions may be made small with the result that the capacitive coupling between the gate electrode 19 and the source and drain electrodes 15 and 17 is negligibly small.

Typical dimensions of the MISFET are as follows:

Source and drain regions: ~0.5 μ deep
Gate width (channel length): ~0.5 μ or less;
Junction, depth ($x_j$): ~0.1 μ.

Figure 3A:
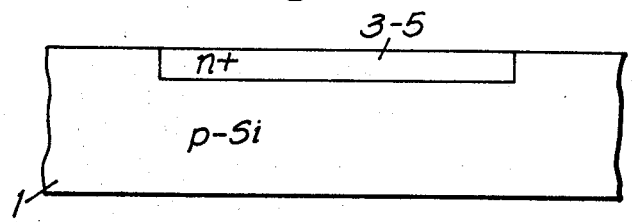
FIGS. 3 (a) to (d) illustrate various stages in the production of the MISFET shown in the preceding figures; and, FIGS. 4 and 5 show a perspective view and a plan view, respectively, of the U-groove of the MISFET shown in FIG. 1, this groove being formed using an orientation dependent etchant (ODE).
Figure 3B:
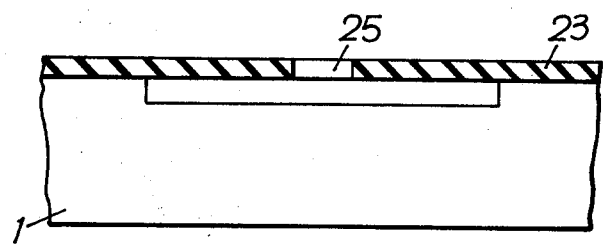

To produce this MISFET a p-type single crystal silicon substrate 1 is provided, the top face of which is aligned parallel to the (110) crystal plane. An excess doped n+-type material layer 3–5 is then formed at the surface of the p-type substrate 1 by conventional diffusion or implant techniques, the area of coverage being defined photolithographically (FIG. 3(a)). Alternatively this layer 3–5 may be epitaxially grown upon the substrate surface. Oxide 23, is then grown over the surface of this substrate and a gate region window 25 is defined using standard photolith definition. Opposite side boundaries of this window are aligned to lie in the {111} crystal planes. (FIG. 3(b)).

Figure 3C:
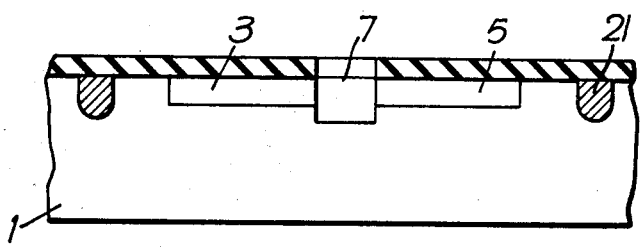

A diazine catalyzed ethylenediamine-pyrocatachol-water solution etchant (see Reisman et al., "The Controlled Etching of Silicon in Catalyzed Ethylenediamine-Pyrocetechol-Water Solution", August 1979 J. Electrochem., Volume 126, number, 8 pp. 1406–1414) is then used to form a groove beneath this window. Electrical bias is applied across the n+-p silicon interface so that etching of the groove proceeds until the groove 7 extends depthwise to the n+-p silicon interface and then action stops automatically. (See Jackson et al., "An Electrical P-N Junction Etch-Stop for the Formation of Silicon Microstructures" IEEE Electron Devices Letters EDL2, No. 2 (1981) p.44–45). This allows formation of a groove of well defined depth, the base of which is predominantly parallel to the (110) face plane, the sides of which are steep, near vertical in fact, both parallel to one of the {111} crystal planes. (FIG. 3(c)). The bias is then removed and etching allowed to continue for a short and controlled period of time to attain a junction depth $x_j$ of the required value. Alternatively, at this stage, a slow etchant could be used for very fine depth control.

Figure 4:
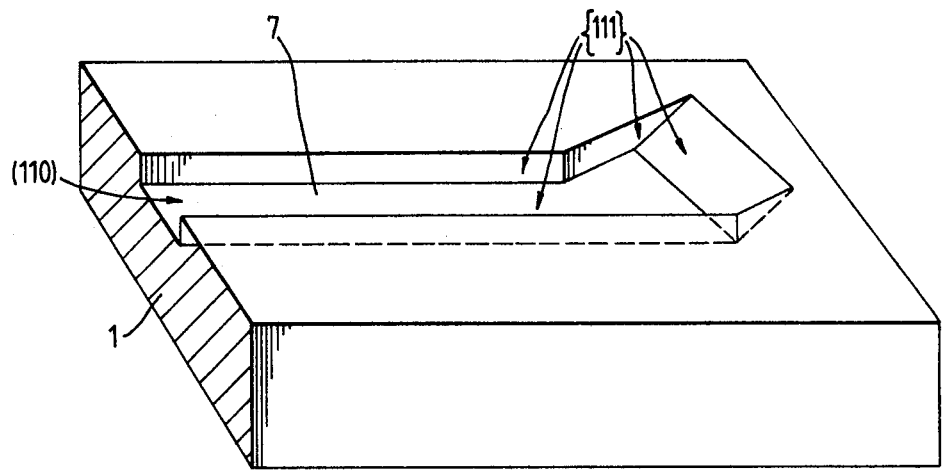
Figure 5:
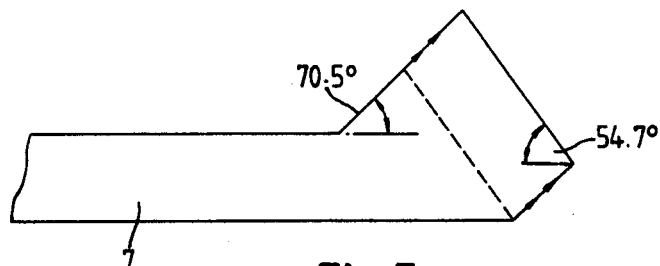

The detailed structure of this groove is shown in FIGS. 4 and 5. (See also Ammar et al., "UMOS Transistors on (110) Silicon" IEEE Transactions on Electron Devices. Vol. ED-27, No. 5 (1980), pp. 907–914). At the ends of the groove the end-wall structure is complex. Using window end boundaries lying in the (110) plane and in the plane orthogonal to this and the (111) plane, results in undercutting and complex structure at these ends. The end wall in each case in defined by two {111} planes, one which is vertical, the other sloping, and inclined to the face plane at an angle of 35° approx.

A channel stop 21 is defined by conventional photolithography—this may be an implant of excess doped p+-type material, as shown, or may be of thick oxide. The structured substrate 1 is then heated in an oxidizing atmosphere and an insulating oxide layer 9 grown over the walls of the groove 7 and over the surface of the n+-type material which has now been divided by the groove into two regions 3 and 5, the source and drain regions of the MISFET.

Figure 3D:
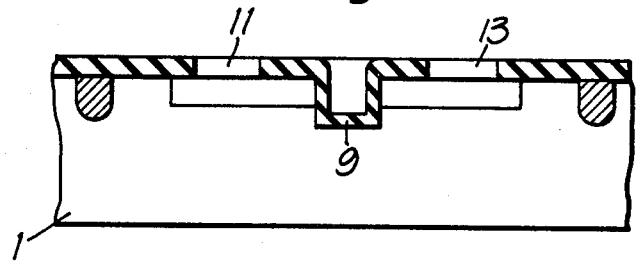

Windows 11, 13 in the oxide layer are now defined photolithographically to expose the source and drain regions 3 and 5 of the n+-type material (FIG. 3(d)). Aluminum metal is then deposited over the upper surface of the remaining oxide 9, over the exposed surfaces of the source and drain regions 3 and 5, and over the base of the groove 7. By evaporating the metal from a point source, coverage of the groove side walls is avoided, due in part to the steepness of these walls, a substantial part of the deposited metal is therefore automatically delineated to define the source and drain contacts 15 and 17 and the gate electrode 19. It is noted that the sloping plane end wall structure allows continuity between metal at the base of the groove 7 and metal deposited on the face plane. The remaining delineation of the surface metallization is then performed photolithographically. The MISFET, thus formed, is then annealed to consolidate the metal-n-+-type silicon junction contact. (FIGS. 1 and 2).

The steep walled groove 7 may be produced using other wet etchants-e.g., potassium hydroxide (App. Phys. Lett., 26, 4, pp. 195–8)—or by alternative techniques such as reactive ion etching or ion beam milling. To ensure gate electrode contact continuity, a ramp surface is then provided at one end of the groove 7. This ramp surface may be produced by depositing suitable material such as polyimide, oxide, sputtered quartz or flow-glass i.e. phosphosilicate glass (PSG)).

Having described the invention and the manner by which it may be performed, we claim:

1. A method for producing a MISFET (metal-insulator-semiconductor field-effect transistor), the method comprising the following steps:
   (a) providing a substrate of single crystal semiconductor material; forming an excess doped region of semiconductor material of opposite conductivity type for
   (b) providing the source and drain regions of the MISFET;
   (c) forming, between and immediately adjacent the source and drain regions, a steep-walled groove extending depthwise at least to the interface between the excess doped material and the underlying substrate material;
   (d) forming an insulating layer over the surface of the groove and over the excess doped material, windows being provided in the layer to expose the source and drain regions of the excess doped material;
   (e) depositing conductive material so to cover simultaneously the exposed source and drain regions and the base of the groove, to exclusion of the steep side-walls of the groove; and
   (f) annealing the whole to consolidate the contact junctions between the conductive material and the excess doped material.

2. A method as claimed in claim 1 wherein the steep-walled groove is formed by etching, using an orientation dependant etchant to define the steep side walls of the groove.

3. A method as claimed in claim 2 wherein the substrate and the doped region are silicon semiconductor material, and the etchant is a diazine catalyzed ethylenediamine-pyrocatechol-water solution; the steep-walled groove being formed exposing (110) crystal plane face of the doped silicon material to the etchant through a mask window the edges of which are aligned with {111} crystal planes.

4. A method as claimed in claim 3 wherein an electrical bias is applied across the doped silicon interface to stop etching action when the groove extends depthwise to the interface.

5. A method as claimed in claim 4 wherein the bias is removed once the etching action has stopped, and etching recontinued for a controlled period of time.

6. A method as claimed in claim 4 wherein once the etching action has stopped the pyrocatechol etchant is replaced by a slow-action etchant and etching recontinued.

7. A method as claimed in claim 1 wherein the conductive material is a metal, and is deposited by evaporation from a point source.

* * * * *